(12) United States Patent
Tanaka (10) Patent No.: US 7,560,773 B2
(45) Date of Patent: Jul. 14, 2009

(54) SEMICONDUCTOR DEVICE

(75) Inventor: Masahiro Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 111 days.

(21) Appl. No.: 11/463,499

(22) Filed: Aug. 9, 2006

(65) Prior Publication Data
US 2007/0085135 A1 Apr. 19, 2007

(30) Foreign Application Priority Data
Oct. 14, 2005 (JP) ............................. 2005-299574

(51) Int. Cl.
*H01L 29/76* (2006.01)
(52) U.S. Cl. .................. 257/341; 257/147; 257/148; 257/149; 257/150; 257/151; 257/152; 257/153; 257/342; 257/345; 257/346; 257/139; 257/156; 257/E27.091; 257/E27.095; 257/E29.274; 257/E29.318
(58) Field of Classification Search ................ 257/500, 257/147–153, 139–154, 341–346, 337, 339, 257/328, E27.091, E27.095, E27.096, E29.274, 257/E29.318
See application file for complete search history.

(56) References Cited
U.S. PATENT DOCUMENTS
5,061,863 A 10/1991 Mori et al.
5,153,696 A 10/1992 Kayama
6,492,689 B2 * 12/2002 Yamauchi et al. ............ 257/379
2003/0227069 A1 * 12/2003 Streit et al. ................. 257/500
2004/0084720 A1 * 5/2004 Esser et al. ................. 257/328
2005/0151254 A1 * 7/2005 Narazaki .................... 257/745
2007/0008062 A1 * 1/2007 Fivas et al. ................... 338/25

FOREIGN PATENT DOCUMENTS
JP 4-93033 3/1992
JP 5-275704 10/1993

* cited by examiner

*Primary Examiner*—Wai-Sing Louie
*Assistant Examiner*—Marc Armand
(74) *Attorney, Agent, or Firm*—Oblon, Spivak, McClelland, Maier & Neustadt, P.C.

(57) ABSTRACT

A vertical-type semiconductor device for controlling a current flowing between electrodes opposed against each other across a semiconductor substrate, including: a semiconductor substrate having first and second surfaces opposed against each other; a first electrode formed in the first surface; a second electrode formed in the second surface through a high-resistance electrode whose resistance is Rs; and a third electrode formed along at least a part of the outer periphery of the second surface, wherein a potential difference Vs between the second and third electrodes is measured with a current I flowing between the first and second electrodes, and the current I is detected from the resistance Rs and the potential difference Vs.

8 Claims, 9 Drawing Sheets

SEMICONDUCTOR DEVICE

CROSS-REFERENCE TO RELATED APPLICATION

The disclosure of Japanese Patent Application No. 2005-299574 filed on Oct. 14, 2005 including specification, drawings and claims is incorporated herein by reference in its entirely.

BACKGROUND OF THE INVENTION

1. Field of the Invention

The present invention is related to a semiconductor device having a current detecting function, and more particularly, to a power semiconductor device in which a current detecting function is deployed in an outer peripheral portion of an electrode.

2. Description of the Related Art

The recent years have seen an increasing demand for a power semiconductor module to have a structure which realizes detection of a current. To meet the demand, detection of a current may be attained for example by means of separate disposition of a resistor element from a power semiconductor element within a power semiconductor module and through measurement of a potential difference between the both ends of the resistor element (JP, 04-93033, A).

However, a structure in which a resistor element is disposed separately from a power semiconductor element has a problem that it requires a space for disposing the resistor element and that the layout of the power semiconductor element and the like must be changed. Further, the newly added resistor element gives rise to a problem that the manufacturing process becomes complex and the manufacturing cost becomes more expensive.

SUMMARY OF THE INVENTION

Accordingly, an object of the present invention is to provide a semiconductor device which is capable of detecting a current without using any newly added resistor element.

The present invention is directed to a vertical-type semiconductor device for controlling a current flowing between electrodes opposed against each other across a semiconductor substrate, including: a semiconductor substrate having first and second surfaces opposed against each other; a first electrode formed in the first surface; a second electrode formed in the second surface through a high-resistance electrode whose resistance is Rs; and a third electrode formed along at least a part of the outer periphery of the second surface, wherein a potential difference Vs between the second and third electrodes is measured with a current I flowing between the first and second electrodes, and the current I is detected from the resistance Rs and the potential difference Vs.

As described above, effectively using the outer peripheral portion in which a current density is small, the semiconductor device according to the present invention can detect a current without increasing the element area size or changing the layout.

DETAILED DESCRIPTION OF THE PREFERRED EMBODIMENTS

Preferred embodiments of the present invention will now be described with reference to the associated drawings. While the expressions like "above", "below", "left" and "right" and phrases containing these expressions will be used below in describing the embodiments, the directions indicated by these expressions are referred to merely for easy understanding of the invention based on the drawings: The technical scope of the present invention includes any examples which are the vertically reversed version of the embodiments or which are the embodiments rotated along any desired direction.

Embodiment 1

Figure 1:
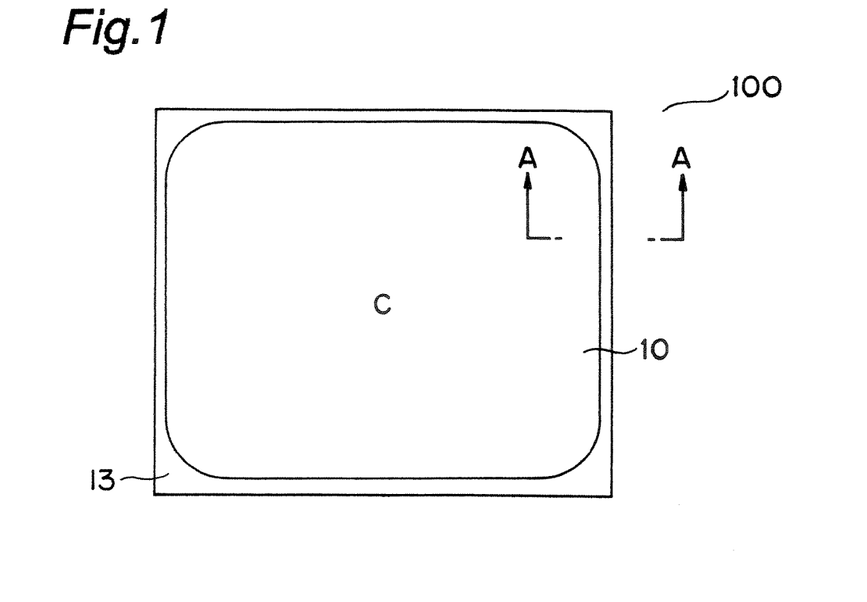
FIG. 1 is a bottom view of an IGBT according to an embodiment 1 of the present invention.
Figure 2A:
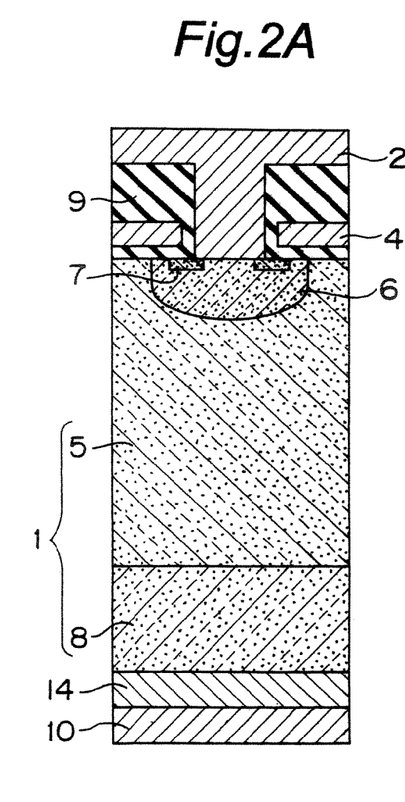
FIGS. 2A and 2B are a cross sectional view of the IGBT according to the embodiment 1 of the present invention.
Figure 2B:
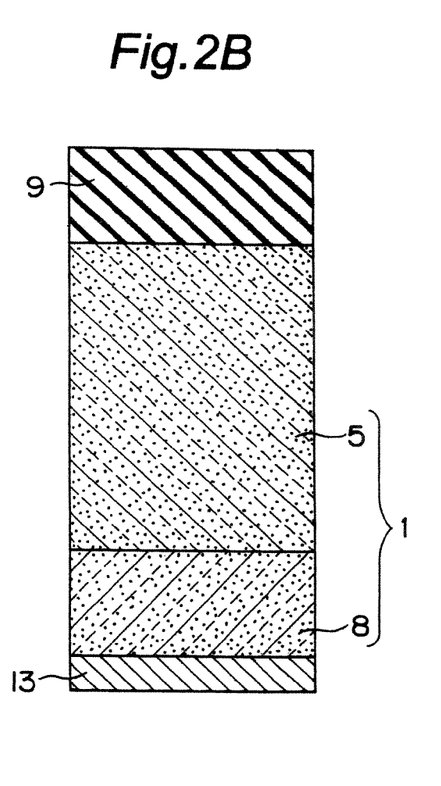

FIG. 1 is a bottom view of an insulated gate bipolar transistor (hereinafter referred to as an "IGBT") generally denoted at 100 according to the embodiment 1, and FIGS. 2A and 2B are a cross sectional view of the IGBT 100 shown in FIG. 1 taken along the direction which is parallel to the plane of the drawing (the direction A in FIG. 1). FIG. 2A is the cross sectional view taken in the region of a collector electrode (region (a)) denoted at 10 in FIG. 1, while FIG. 2B is the cross sectional view taken in the region of a ring-like sense collector electrode (region (b)) denoted at 13 in FIG. 1.

As shown in FIGS. 1, 2A and 2B, the IGBT 100 includes a silicon substrate 1 which contains an n− base layer 5 and a p+ collector layer 8.

In the region (a), there is a resistor layer 14 under the collector layer 8, and there is a collector electrode 10 under the resistor layer 14. The top surface of the base layer 5 includes a p base layer 6, and an n− emitter layer 7 is formed in the base layer 6. Further, an insulation film 9 containing a gate electrode 4 is disposed on the base layer 5, and an emitter electrode 2 is disposed such that it partially contacts the p base layer 6 and the n− emitter layer 7 and it covers the insulation film 9.

In the region (b), there is a sense collector electrode 13 under the collector layer 8. Meanwhile, the top of the base layer 5 is coated with the insulation film 9.

Figure 3:
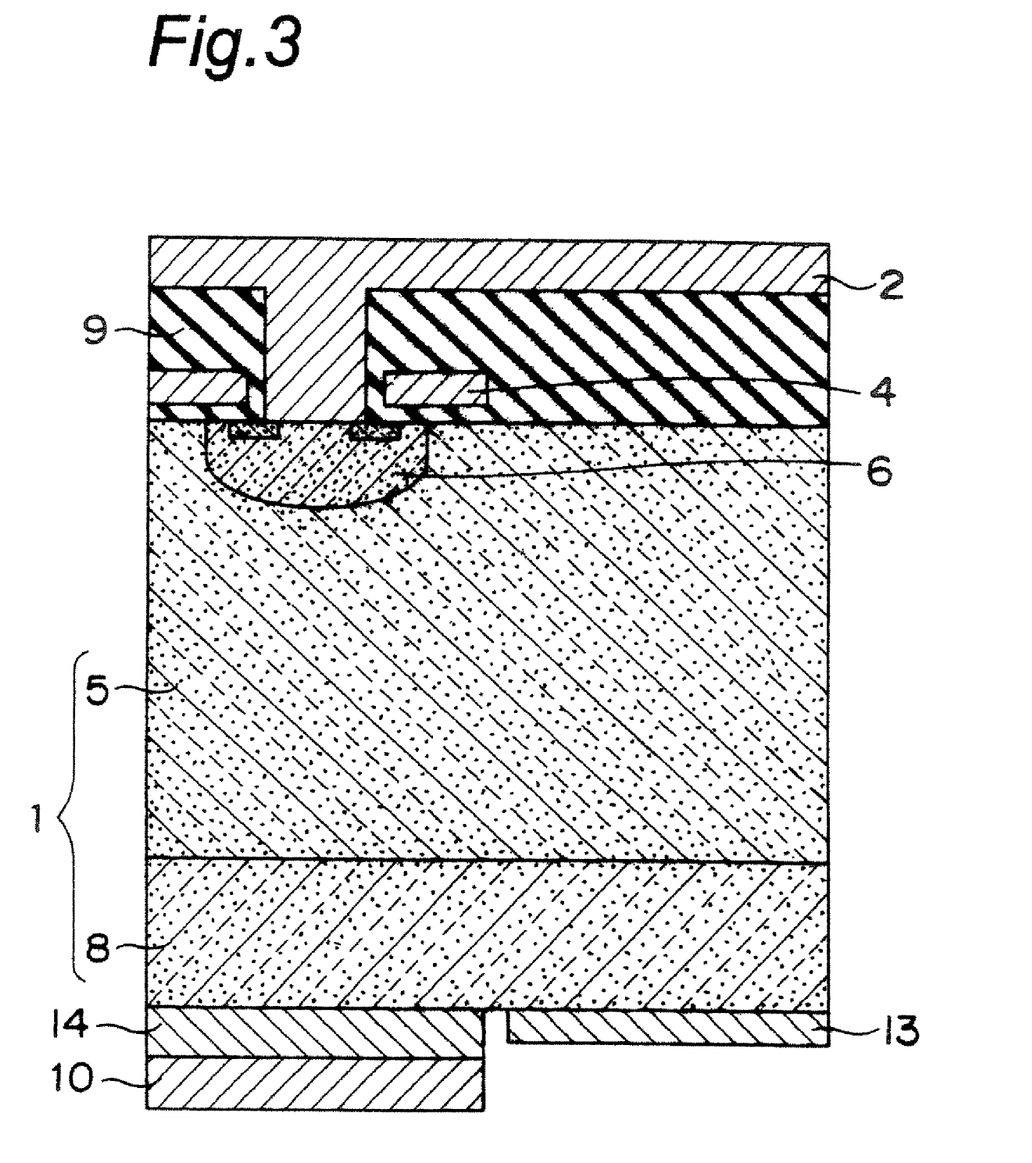
FIG. 3 is a cross sectional view of the IGBT according to the embodiment 1 of the present invention.

FIG. 3 is a cross sectional view of FIG. 1 taken along the A-A direction, where the numerals which are identical with those of FIG. 2 denote identical components. As shown in FIG. 3, the collector electrode 10 and the sense collector electrode 13 do not contact with each other at the boundary between the region (a) and the region (b).

In the structure in FIG. 3, the resistor layer 14 is formed thicker than the sense collector electrode 13, thereby creating a step between the collector electrode 10 and the sense collector electrode 13, and patterning which creates a clearance between the electrodes ensures no contact between the electrodes.

For instance, the collector electrode 10, the sense collector electrode 13 and the emitter electrode 2 are made of aluminum, while the gate electrode 4 is made of polycrystalline silicon. The resistor layer 14 whose resistance is higher than those of the collector electrode 10 and the sense collector electrode 13 is made of nickel for example. The insulation film 9 is made of silicon oxide for example.

Although the foregoing is directed to an example that nickel is used for the resistor layer 14, a similar function can be realized by a resistor layer which is obtained by forming a p− layer inside the p+ collector layer 8 of the silicon substrate 1.

An operation of the IGBT 100 will now be described. In general, as a voltage is applied between the gate electrode 4 and the emitter electrode 2 with a voltage applied between the collector electrode 10 and the emitter electrode 2, a current I flows between the collector electrode 10 and the emitter electrode 2 in the IGBT 100.

In the IGBT 100, the resistor layer 14 is located between the collector layer 8 and the collector electrode 10. Hence, as the current I flows between the collector electrode 10 and the emitter electrode 2, the existence of the resistor layer 14 (having the resistance Rs) develops a potential difference Vs between the collector electrode 10 and the sense collector electrode 13.

The resistance Rs of the resistor layer 14 can be set to a desired design value by means of adjustment of the material, the film thickness of the like of the resistor layer 14. The potential difference Vs between the collector electrode 10 and the sense collector electrode 13 roughly corresponds to a voltage drop at the resistor layer 14.

Measurement of the potential difference Vs therefore makes it possible to calculate, from the potential difference Vs and the resistance Rs, the current I which is carried by the collector electrode 10.

Generally used techniques such as photolithography, ion implantation and thermal diffusion may be applied to manufacturing of the IGBT 100. The collector electrode 10 and the sense collector electrode 13 are formed as follows: After forming a nickel layer, i.e., the material of the resistor layer 14 on the bottom surface of the collector layer 8, the nickel layer is selectively removed only in the region of the sense collector electrode 13 (peripheral portion) so that the remaining nickel layer will serve as the resistor layer 14, an aluminum layer is formed by sputtering or the like all over the surface so that the aluminum layer on the resistor layer 14 will serve as the collector electrode 10 and the aluminum layer around this on the collector layer 8 will serve as the sense collector electrode 13. It is ensured during this process that the collector electrode 10 and the sense collector electrode 13 will not be connected directly with each other.

In the event that a p layer rather than a nickel layer is used as the resistor layer 14, within a region to form the collector electrode in the p+ collector layer, a p− layer is formed through injection and diffusion of n-type impurities or otherwise appropriately.

A vertical-type MOSFET and a diode according to embodiments described below can be fabricated similarly, using these generally used manufacturing techniques.

In the IGBT 100 according to the embodiment 1, the sense collector electrode 13 which is used for measurement of the potential difference Vs is formed in the outer peripheral portion within the back surface of the IGBT 100. Since a current density is low in such an outer peripheral portion inside a high breakdown voltage semiconductor element such as an IGBT, the outer peripheral portion is not used to make the semiconductor element operate and a terminating structure such as a guard ring is disposed in the outer peripheral portion.

In the IGBT 100 according to the embodiment 1, since the sense collector electrode 13 is formed in the outer peripheral portion, it is possible to make an effective use of the outer peripheral portion in which a current density is low, and the disposition of the sense collector electrode 13 does not enlarge the element area size. Further, it is not necessary to change the emitter electrode side layout.

Figure 4:
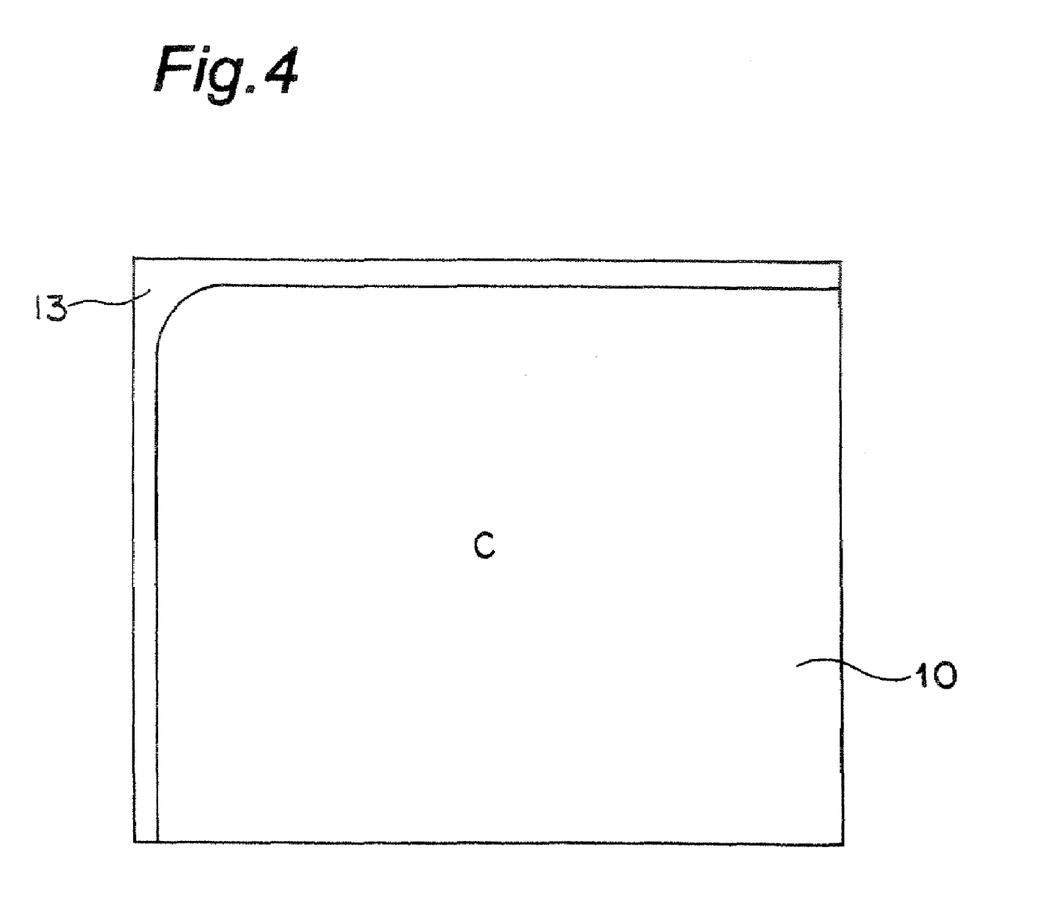
FIG. 4 is a bottom view of the IGBT according to the embodiment 1 of the present invention.

Although the structure in FIG. 1 is such a structure that the sense collector electrode 13 completely surrounds the collector electrode 10, the sense collector electrode 13 may surround the collector electrode 10 partially. One example is a structure as that shown in FIG. 4 that a sense collector electrode is disposed on two sides of the collector electrode 10. This similarly applies also to the embodiments described below.

Figure 5:
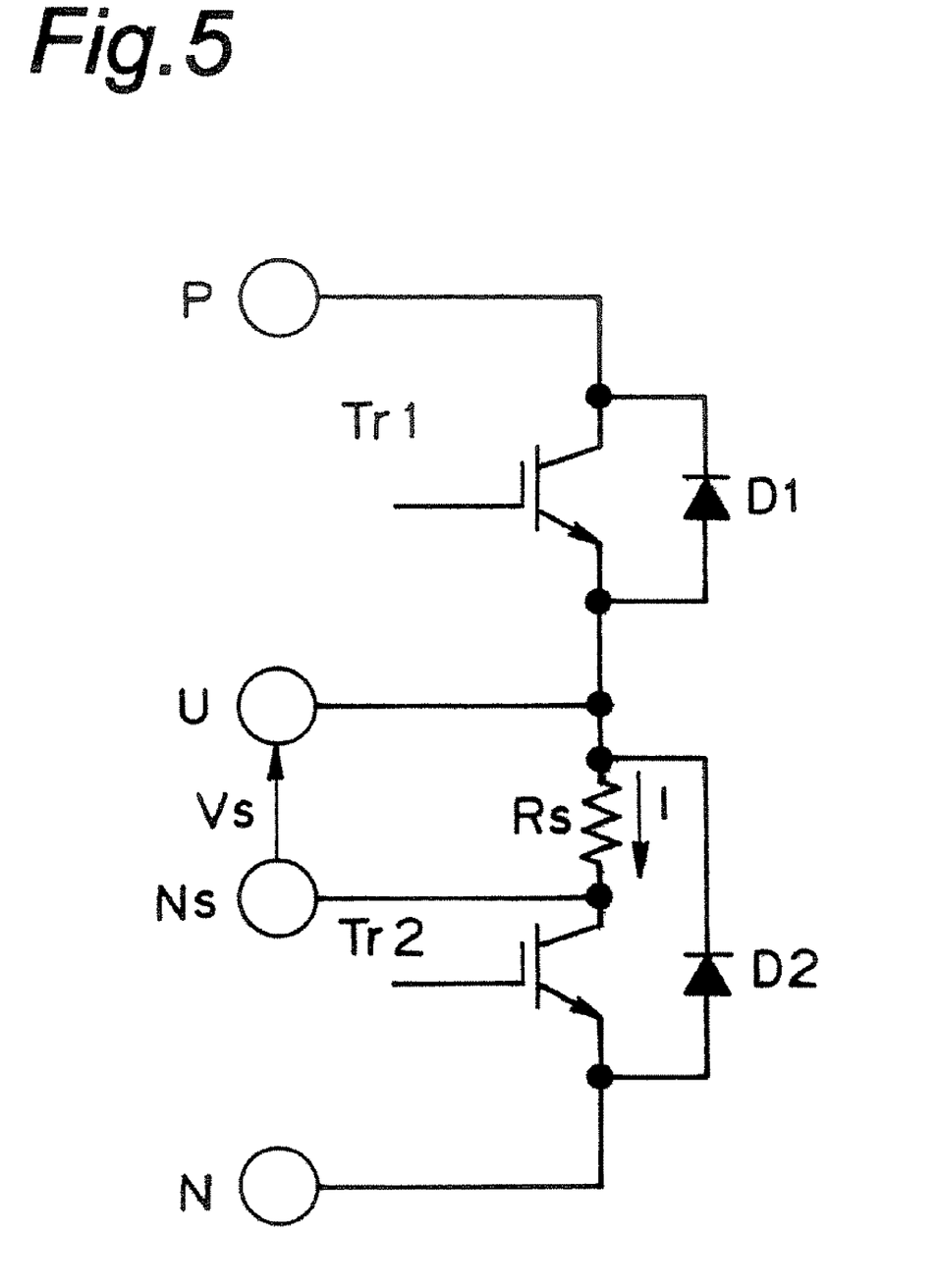
FIG. 5 shows an inverter circuit contained in a power semiconductor module according to the embodiment 1 of the present invention.

FIG. 5 shows an inverter circuit contained in a power semiconductor module which uses the IGBT according to the embodiment 1 of the present invention. In the inverter circuit, two transistors Tr1 and Tr2 are connected in series and diodes D1 and D2 are connected in anti-parallel respectively to the transistors Tr1 and Tr2, thereby constituting a half-bridge circuit. Further, for detection of a current which flows between terminals U and N, a resistor Rs is formed inside the transistor Tr2. Measurement of the potential difference Vs across the resistor Rs attains detection of the current I.

Figure 6:
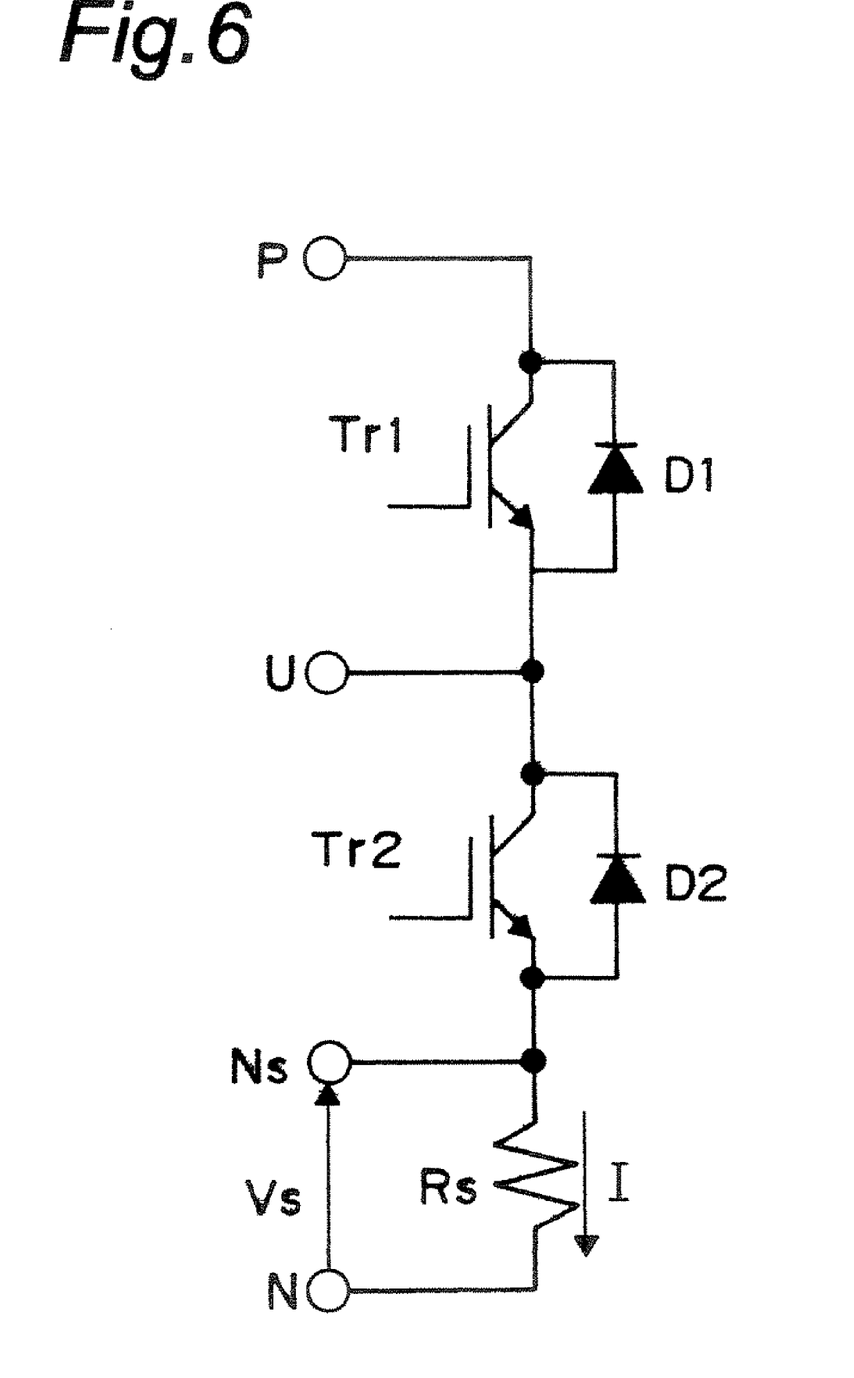
FIG. 6 shows an inverter circuit contained in a conventional power semiconductor module.

FIG. 6 shows an inverter circuit which is contained in a conventional power semiconductor module. In this inverter circuit, a resistor Rs is disposed separately from transistors Tr1 and Tr2, and as a potential difference Vs across the resistor Rs is measured, a current I is detected.

Figure 7:
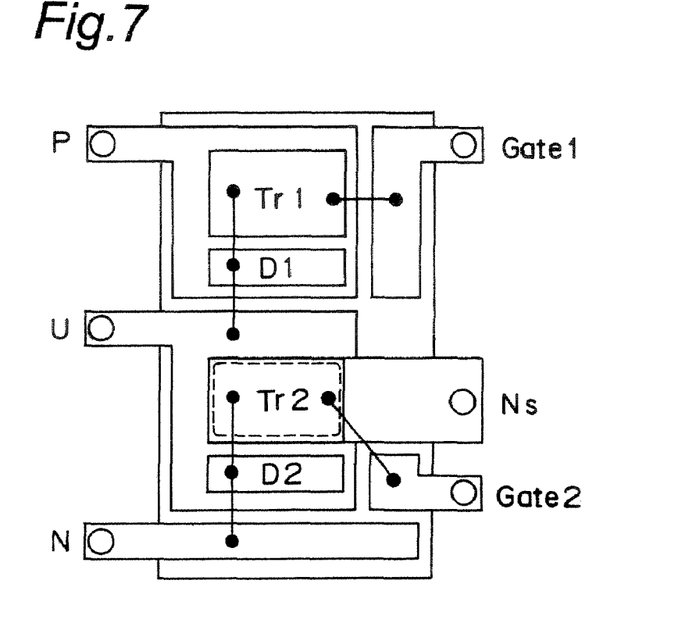
FIG. 7 is a layout diagram of the power semiconductor module according to the embodiment 1 of the present invention.
Figure 8:
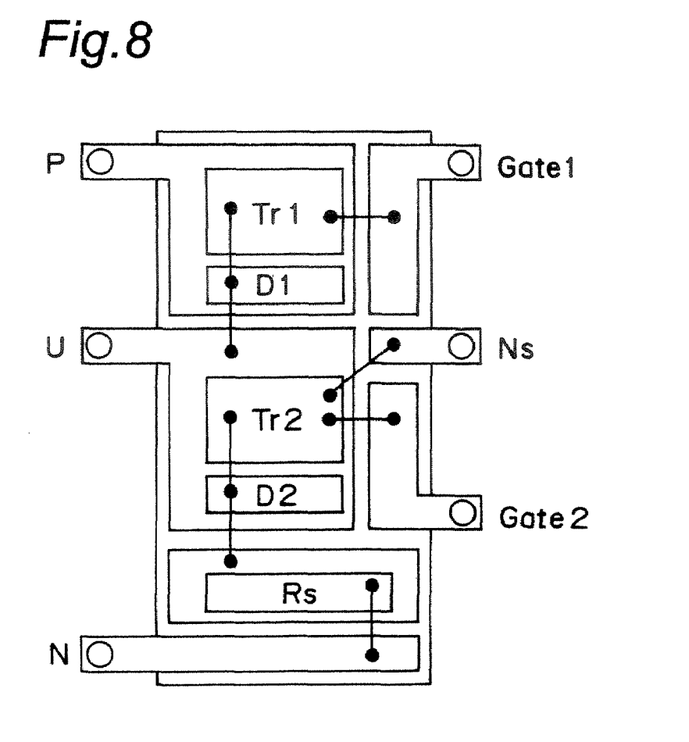
FIG. 8 is a layout diagram of the conventional power semiconductor module.

FIGS. 7 and 8 are layout diagrams of power semiconductor modules which correspond to FIGS. 5 and 6, of which FIG. 7 shows a power semiconductor module which uses the IGBT according to the embodiment 1 while FIG. 8 shows a conventional power semiconductor module.

Comparison of FIGS. 7 and 8 against each other makes it clear that the conventional power semiconductor module must secure a region for disposing the resistor Rs as the resistor Rs needs be disposed separately from the transistors Tr1 and Tr2. In contrast, in the power semiconductor module according to the embodiment 1, it is not necessary to separately dispose the resistor Rs since a collector electrode (not shown) of the transistor Tr2 has a resistor component, which permits reducing the size of the power semiconductor module.

Figure 9:
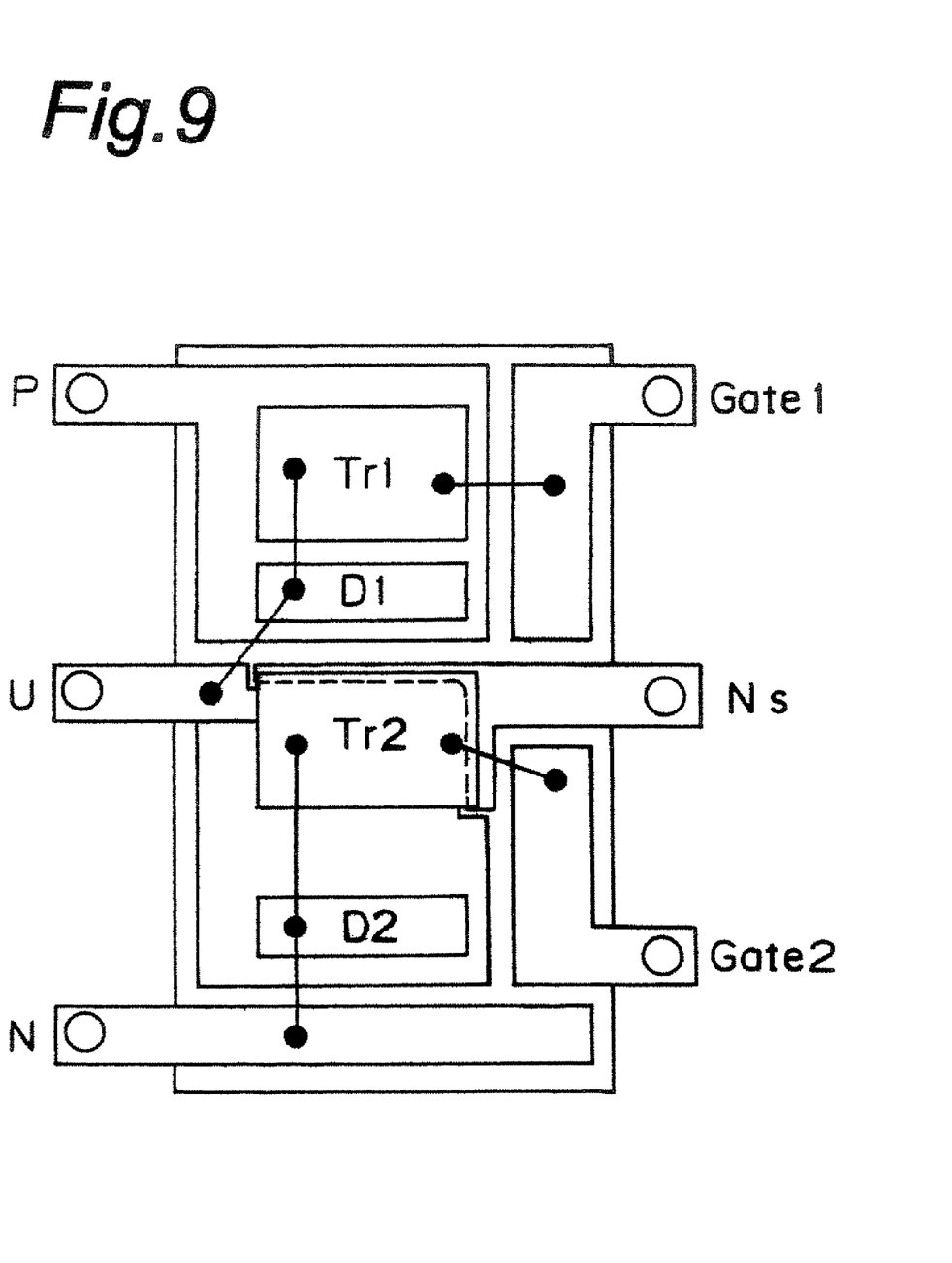
FIG. 9 is a layout diagram of other power semiconductor module according to the embodiment 1 of the present invention.

While the sense collector electrode 13 completely surrounds the collector electrode 10 (FIG. 1) in this structure illustrated in this drawing and it is therefore necessary that the circuit board has a multi-layer interconnection structure and an insulation film is disposed on interconnections, use of the structure shown as other example of the embodiment 1 that the sense collector electrode 13 partially surrounds (FIG. 4) permits use of a circuit board having a conventional interconnection layer structure as that shown in FIG. 9.

Embodiment 2

Figure 10:
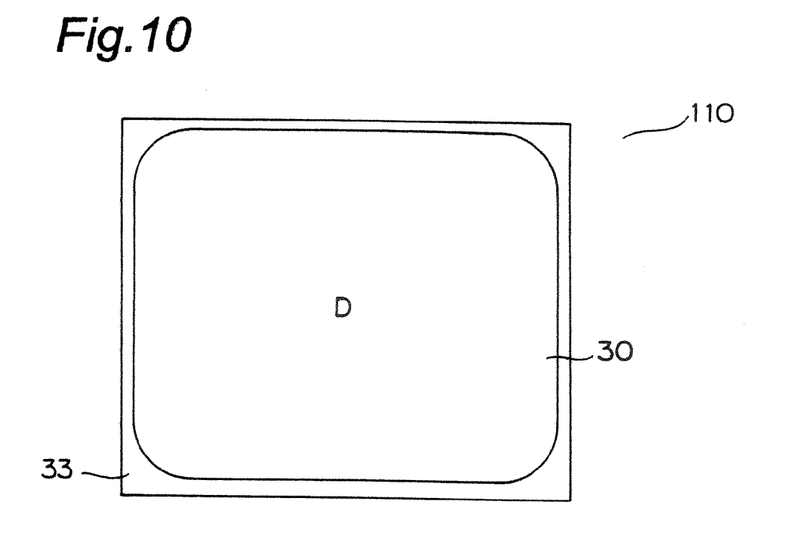
FIG. 10 is a bottom view of a vertical-type MOSFET according to an embodiment 2 of the present invention.
Figure 11A:
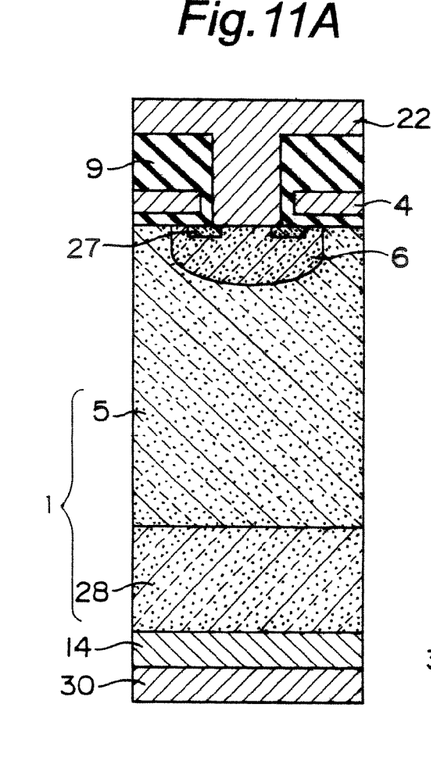
FIGS. 11A and 11B are a cross sectional view of the vertical-type MOSFET according to the embodiment 2 of the present invention.
Figure 11B:
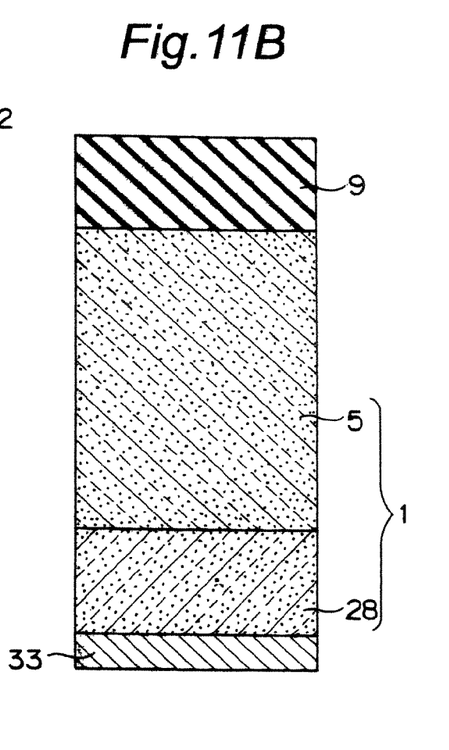

FIG. 10 is a bottom view of a vertical-type MOSFET generally denoted at 110 according to the embodiment 2, and FIGS. 11A and 11B are a cross sectional view of the MOSFET 110 shown in FIG. 10 taken along the direction which is parallel to the plane of the drawing. FIG. 11A is the cross sectional view taken in the region of a drain electrode (region (a)) denoted at 30 in FIG. 10, while FIG. 11B is the cross sectional view taken in the region of a ring-like sense drain electrode (region (b)) denoted at 33 in FIG. 10 and surrounding the drain electrode 30.

In FIGS. 10, 11A and 11B, components denoted at the same numerals as those used in FIGS. 1, 2A and 2B are the same or corresponding components. The fact that the structures of the emitter electrode 2, the n− emitter layer 7 and the collector layer 8 shown in FIGS. 1, 2A and 2B serve respectively as a source electrode 22, a source layer 27 and a drain layer 28 in FIGS. 10, 11A and 11B because of a difference between an IGBT and a MOSFET is well known to those skilled in the art, and therefore, details of this will not be described here.

The resistor layer 14 may be a resistor layer which is obtained by forming an n− layer within the n+ drain layer 28 of the silicon substrate 1, as such a resistor layer functions similarly.

As in the IGBT 100 described above, the MOSFET 110 according to the embodiment 2 permits making an effective use of an outer peripheral portion in which a current density is low and which is within the back surface of the MOSFET 110, as the sense drain electrode 33 which is used for measurement of the potential difference Vs is formed in the outer peripheral portion. Hence, even despite the sense drain electrode 33, the element area size does not increase, and further, it is not necessary to change the source electrode side layout.

Embodiment 3

Figure 12:
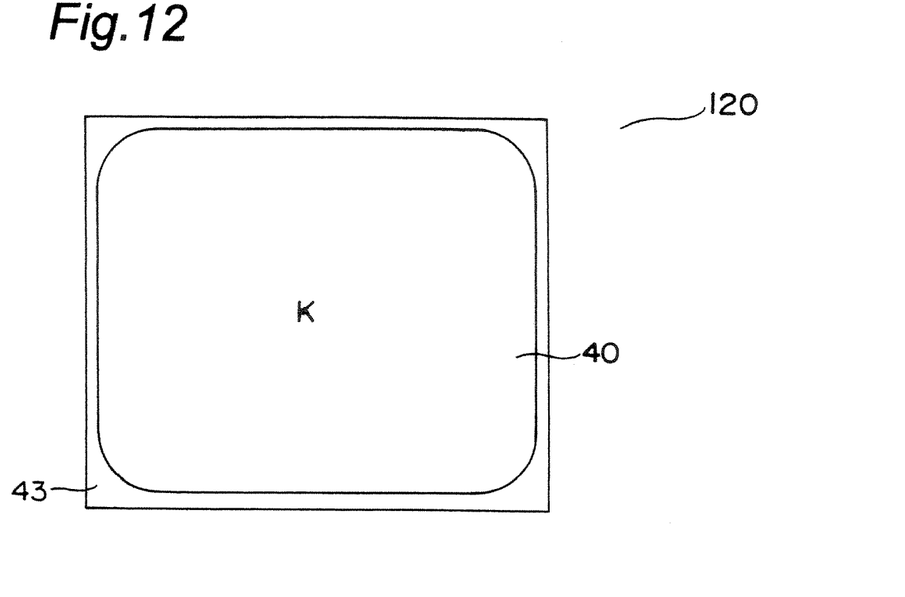
FIG. 12 is a bottom view of a vertical-type diode according to an embodiment 3 of the present invention.
Figures 13A, 13B:
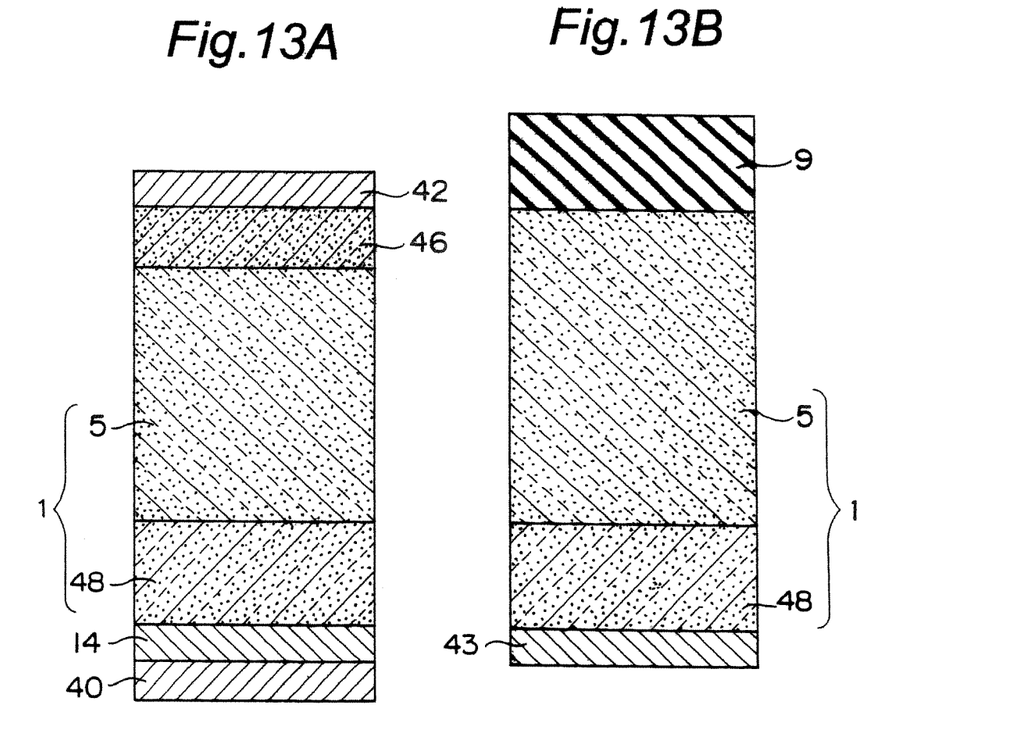
FIGS. 13A and 13B are a cross sectional view of the vertical-type diode according to the embodiment 3 of the present invention.

FIG. 12 is a bottom view of a vertical-type diode generally denoted at 120 according to the embodiment 3, and FIGS. 13A and 13B are a cross sectional view of the diode 120 shown in FIG. 12 taken along the direction which is parallel to the plane of the drawing. FIG. 13A is the cross sectional view taken in the region of a cathode electrode denoted at 40 in FIG. 12, while FIG. 13B is the cross sectional view taken in the region of a ring-like sense cathode electrode (region (b)) denoted at the 43 in FIG. 12 and surrounding the cathode electrode 40.

In FIGS. 12, 13A and 13B, components denoted at the same numerals as those used in FIGS. 1, 2A and 2B are the same or corresponding components.

The resistor layer 14 may be a resistor layer which is obtained by forming an n− layer within the n+ cathode layer 48 of the silicon substrate 1, as such a resistor layer functions similarly.

As shown in FIGS. 12, 13A and 13B, the diode 120 includes the silicon substrate 1 which contains the n− base layer 5 and the n+ cathode layer 48.

In the region (a), there is the resistor layer 14 under the cathode layer 48, and there is the cathode electrode 40 under the resistor layer 14. Meanwhile, there are a p anode layer 46 and an anode electrode 42 formed on the base layer 5.

In the region (b), there is the sense cathode electrode 43 under the cathode layer 48. The top of the base layer 5 is coated with the insulation film 9. The cathode electrode 40 and the sense cathode electrode 43 are formed such that they do not contact with each other.

In the diode 120, when a voltage is applied between the cathode electrode 40 and the anode electrode 42, the current I flows between these two electrodes. This develops the potential difference Vs attributable to the resistor layer 14, between the cathode electrode 40 and the sense cathode electrode 43.

Hence, measurement of the potential difference Vs permits calculating the current I from the potential difference Vs and the resistor Rs of the resistor layer 14, which is similar in the embodiment 1.

As in the MOSFET 110 described above, in the diode 120 according to the embodiment 3, since the sense cathode electrode 43 which is used for measurement of the potential difference Vs is formed in an outer peripheral portion within the back surface of the diode 120, it is possible to effective utilize the outer peripheral portion in which a current density is low, and therefore, even despite the sense cathode electrode 43, the element area size does not increase. Further, it is not necessary to change the anode electrode side layout.

What is claimed is:

1. A vertical-type semiconductor device for controlling a current flowing between electrodes opposed against each other across a semiconductor substrate, comprising:
   a semiconductor substrate having first and second surfaces opposed against each other;
   a first electrode formed on the first surface;
   a second electrode formed on the second surface through a high-resistance electrode; and
   a third electrode formed along at least a part of the outer periphery of the second surface in direct contact with the second surface.

2. The semiconductor device according to claim 1, wherein the vertical-type semiconductor device is a device selected from the group consisting of an insulated gate bipolar transistor, a vertical-type MOSFET and a vertical-type diode.

3. The semiconductor device according to claim 1, wherein the third electrode is a ring-like electrode which is formed along the outer periphery of the second surface of the semiconductor substrate.

4. The semiconductor device according to claim 1, wherein the high-resistance electrode is in contact with the second surface of the semiconductor surface.

5. The semiconductor device according to claim 1, wherein a gap separates the high-resistance electrode and the third electrode, so that the high-resistance electrode and the third electrode are not in contact with each other.

6. The semiconductor device according to claim 1, wherein a thickness of the layer of that forms the high-resistance electrode is thicker than the third electrode.

7. The semiconductor device according to claim 1, wherein the second electrode is vertically arranged underneath a contact location of the first electrode with the first surface of the semiconductor substrate.

8. The semiconductor device according to claim 3, wherein the vertical-type semiconductor device is a device selected from the group consisting of an insulated gate bipolar transistor, a vertical-type MOSFET and a vertical-type diode.

* * * * *